United States Patent
Lin et al.

(10) Patent No.: US 10,342,166 B2
(45) Date of Patent: Jul. 2, 2019

(54) COOLING SYSTEMS FOR SMALL EQUIPMENT ROOMS AND METHODS OF COOLING SMALL EQUIPMENT ROOMS

(71) Applicant: Liebert Corporation, Columbus, OH (US)

(72) Inventors: Wanlai Lin, Dublin, OH (US); Tyler Voigt, Delaware, OH (US); Gaurav Jain, Columbus, OH (US); Benedict J. Dolcich, Westerville, OH (US)

(73) Assignee: Vertiv Corporation, Columbus, OH (US)

( * ) Notice: Subject to any disclaimer, the term of this patent is extended or adjusted under 35 U.S.C. 154(b) by 252 days.

(21) Appl. No.: 15/297,238

(22) Filed: Oct. 19, 2016

(65) Prior Publication Data

US 2017/0118874 A1   Apr. 27, 2017

Related U.S. Application Data

(60) Provisional application No. 62/244,216, filed on Oct. 21, 2015.

(51) Int. Cl.
*H05K 7/20*   (2006.01)
*F24F 11/00*   (2018.01)

(52) U.S. Cl.
CPC ..... *H05K 7/20836* (2013.01); *H05K 7/20145* (2013.01); *H05K 7/20309* (2013.01);
(Continued)

(58) Field of Classification Search
CPC ....... F24F 2011/0002; F24F 2011/0004; F24F 2011/0006; Y02B 30/54; Y02B 30/542
See application file for complete search history.

(56) References Cited

U.S. PATENT DOCUMENTS 5,447,037 A * 9/1995 Bishop ............... F24F 3/044
62/89
6,038,879 A * 3/2000 Turcotte ............. F24F 1/022
62/325
(Continued)

FOREIGN PATENT DOCUMENTS

WO   WO-2009089618 A1   7/2009
WO   WO-2013-095621 A1   6/2013

OTHER PUBLICATIONS

Phillips, Buddy, "Keeping It Simple With Data-Center Cooling", by HPAC Engineering http://hpac.com/air-conditioning/keeping-simple-data-center-cooling-0611, Jun. 1, 2011.
(Continued)

*Primary Examiner* — Jonathan Bradford
(74) *Attorney, Agent, or Firm* — Harness, Dickey & Pierce, P.L.C.

(57) ABSTRACT

A cooling system for an equipment closet in a building has a direct expansion cooling circuit. The cooling system has two basic modes of operation. A first mode where the direct expansion cooling circuit is off and transfer air from an area of the building outside the equipment closet is used to cool the interior of the equipment closet without any cooling provided by the direct expansion cooling circuit and a second mode where the direct expansion cooling circuit is on and provides direct expansion cooling that is used to cool the interior of the equipment closet.

3 Claims, 6 Drawing Sheets

(52) U.S. Cl.
CPC ..... *H05K 7/20318* (2013.01); *H05K 7/20354* (2013.01); *H05K 7/20745* (2013.01); *H05K 7/20818* (2013.01); *F24F 2011/0004* (2013.01); *F24F 2011/0006* (2013.01); *Y02B 30/542* (2013.01)

(56) References Cited

U.S. PATENT DOCUMENTS

| | | | |
|---|---|---|---|
| 7,770,806 B2 | 8/2010 | Herzon et al. | |
| 8,406,929 B2 | 3/2013 | Duncan | |
| 8,689,580 B2 * | 4/2014 | Lakdawala | F24F 5/0071 62/411 |
| 8,721,409 B1 * | 5/2014 | Morales | H05K 7/20209 454/184 |
| 8,783,053 B2 | 7/2014 | McCann | |
| 8,800,307 B2 | 8/2014 | Thogersen et al. | |
| 8,881,541 B2 | 11/2014 | Noll et al. | |
| 8,959,940 B2 | 2/2015 | Yamashita et al. | |
| 2008/0135635 A1 | 6/2008 | Deng et al. | |
| 2009/0210096 A1 * | 8/2009 | Stack | F24F 11/30 700/278 |
| 2009/0301123 A1 | 12/2009 | Monk et al. | |
| 2011/0195652 A1 | 8/2011 | Smith | |
| 2012/0167610 A1 | 7/2012 | Dunnavant | |
| 2012/0318007 A1 | 12/2012 | Lukasse et al. | |
| 2013/0005235 A1 * | 1/2013 | Ootani | F24F 11/0001 454/184 |
| 2013/0098085 A1 | 4/2013 | Judge et al. | |
| 2013/0269685 A1 | 10/2013 | Wachtel et al. | |
| 2015/0007596 A1 | 1/2015 | Bean, Jr. et al. | |
| 2015/0053430 A1 | 2/2015 | Beresford | |
| 2015/0059380 A1 | 3/2015 | Takayama et al. | |
| 2015/0068228 A1 * | 3/2015 | Sedlak | F25B 25/005 62/79 |

OTHER PUBLICATIONS

Rasmussen, Neil et al., "Cooling Strategies for IT Wiring Closets and Small Rooms", http://www.apcmedia.com/salestools/NRAN-6NDTJM/NRAN-6NDTJM_R1_EN.pdf?sdirect=true, Schneider Electric—Data Center Science Center, 2011.

"Small Room Cooling" by Emerson Network Power, http://www.emersonnetworkpower.com/en-US/Products/PrecisionCooling/SmallRoomCooling/Pages/default.aspx, 2016.

Rasmussen, Neil et al., "Cooling Strategies for IT Wiring Closets and Small Rooms", http://www.apcdistributors.com/white-papers/Cooling/WP-68%20Cooling%20Strategies%20for%20IT%20Wireing%20Closets%20and%20Small%20Rooms.pdf, American Power Conversion, 2007.

Evans, Tony, "The Different Types of Air Conditioning Equipment for IT Environments", http://www.apcdistributors.com/white-papers/Cooling/WP-59%20The%20Different%20Types%20of%20Air%20Conditioning%20Equipment%20for%20IT%20Environments.pdf, American Power Conversion White Paper #59, 2004.

Written Opinion of the International Searching Authority for PCT/US2016/057705, dated Jan. 31, 2017.

International Search Report for PCT/US2016/057705, dated Jan. 31, 2017.

* cited by examiner

COOLING SYSTEMS FOR SMALL EQUIPMENT ROOMS AND METHODS OF COOLING SMALL EQUIPMENT ROOMS

CROSS-REFERENCE TO RELATED APPLICATIONS

This application claims the benefit of U.S. Provisional Application No. 62/244,216 filed on Oct. 21, 2015. The entire disclosure of the above application is incorporated herein by reference.

FIELD

The present disclosure relates to cooling systems for small equipment rooms and methods of cooling small equipment rooms with these cooling systems.

BACKGROUND

This section provides background information related to the present disclosure which is not necessarily prior art.

The data center room for a small enterprise is typically housed in the same building as the enterprise itself. It is typically a small room, often referred to as an equipment closet. Among the leading methods of cooling such small rooms is to install a ceiling mount or wall mount DX (direct expansion) air conditioning system that blows cold air in to the room and discharges condenser heat to an outdoor condensing unit. This method uses only DX cooling and the cooling system is difficult to install, requires a separate indoor evaporator unit with remote outdoor condensing unit (2 boxes and a line set), requires field charging, requires complex outdoor condensers with the ability to operate in cold climates, and can tend to overcool and require reheat.

SUMMARY

This section provides a general summary of the disclosure, and is not a comprehensive disclosure of its full scope or all of its features.

In accordance with an aspect of the present disclosure, an equipment closet disposed in a building is cooled with a cooling system. The cooling system has a direct expansion cooling circuit that includes a compressor, a condenser having a condenser coil and a condenser fan, an expansion device and an evaporator having an evaporator coil and an evaporator fan that are arranged in the direct expansion cooling circuit. At least the evaporator is disposed in a cabinet in the equipment closet. The cooling system is operated in a first mode of operation with the direct expansion cooling circuit off to cool an interior of the equipment closet with transfer air drawn in from an area of the building outside of the equipment closet and operated in a second mode of operation with the direct expansion cooling circuit running to cool the interior of the equipment closet with air cooled by the direct expansion cooling circuit. Operation of the cooling system is controlled with a controller by having the controller operate the cooling system in the first mode of operation when the controller determines that operating the cooling system in the first mode of operation will meet a cooling demand due to heat load in the interior of the equipment closet and having the controller operate the cooling system in the second mode of operation when the controller determines that operating the cooling system in the first mode of operation won't meet the cooling demand.

In an aspect, the cooling system is a self-contained cooling system with associated sensors.

In accordance with an aspect of the present disclosure, a floor mounted, wall facing cooling system for an equipment closet has a direct expansion cooling circuit disposed in a cabinet. The direct expansion cooling circuit has an evaporator, evaporator fan, condenser, condenser fan, compressor and expansion device. The cooling system draws transfer air in from an area of the building outside of the equipment closet through a transfer air inlet of the cabinet. The transfer air in the area of the building adjacent the transfer air inlet of the cabinet is cooled by a cooling system of the building in which the equipment closet is located. The cooling system has two basic modes of operation. A first mode where the direct expansion cooling circuit is off and the transfer air is used to cool the interior of the equipment closet without any cooling provided by the direct expansion cooling circuit and a second mode where the direct expansion cooling circuit is on and provides direct expansion cooling that is used to cool the interior of the equipment closet. In an aspect, the cooling system includes a controller that is configured to control the cooling system to operate in the first mode when the heat load is sufficiently small that the transfer air can sufficiently cool the equipment in the equipment closet without any cooling provided by the direct expansion cooling circuit and to operate the cooling system in the second mode when the heat load is large enough that the transfer air cannot adequately cool the equipment in the equipment closet without additional cooling provided by the direct expansion cooling circuit. That is, the controller operates the cooling system in the first mode of operation when the controller determines that operating the cooling system in the first mode of operation will meet a cooling demand due to heat load in the interior of the equipment closet and the controller operates the cooling system in the second mode of operation when the controller determines that operating the cooling system in the first mode of operation won't meet the cooling demand.

In an aspect, when the cooling system is in the first mode of operation the evaporator fan is running and the condenser fan is off. When the cooling system is in the second mode of operation, both the evaporator fan and the condenser fan are running. The running evaporator fan discharges air into the interior of the equipment closet to positively pressurize the interior of the equipment closet. Hot air in the interior of the equipment closet is thus exhausted by the positive pressure in the interior of the equipment closet through an opening in a drop ceiling of the equipment closet into a ceiling space between the drop ceiling and a ceiling above the equipment closet and then from the ceiling space through an exhaust opening into the building environment surrounding the equipment closet.

In an aspect, the cooling system is a self-contained cooling system with associated sensors contained in the cabinet along with the evaporator, condenser, and expansion device.

In accordance with an aspect of the present disclosure, a split-modular cooling system has a direct expansion cooling circuit having an evaporator, evaporator fan, condenser, condenser fan, compressor and expansion device. The compressor, evaporator and direct expansion device are disposed in a first cabinet that is disposed on a floor of the equipment closet. A fan coil portion of a condenser is disposed in a second cabinet mounted on a wall of the equipment closet. The fan coil portion includes a condenser coil and a condenser fan. The second cabinet has a hot air outlet through which hot air is exhausted to an area of the building outside of the equipment closet. When the condenser fan is running, air is discharged by the condenser fan through the hot air outlet which also pulls air from the equipment closet across the condenser coil. When the condenser fan is not running, the interior of the equipment closet is positively pressurized by the evaporator fan blowing transfer air into the interior of the equipment closet which forces hot air in the interior of the equipment closet out through the hot air outlet of the second cabinet. The split-modular cooling system also has the same two basic modes of operation described above.

In accordance with an aspect of the present disclosure, a cooling system for an equipment closet includes a cabinet configured to be at least partially disposed in the equipment closet having an upper portion and a lower portion. The cabinet includes a wall between the upper and lower portions of the cabinet separating the upper and lower portions of the cabinet to provide separate transfer air flow paths through the upper and lower portions of the cabinet. The cooling system includes an evaporator, evaporator fan, condenser, condenser fan, compressor and expansion device arranged in a direct expansion cooling circuit. At least the evaporator is disposed in the lower portion of the cabinet and at least the condenser is disposed in an upper portion of the cabinet. The cooling system is configured to draw in transfer air from an area of the building outside the equipment closet through a transfer air inlet and discharge this transfer air into an interior of the equipment closet to cool the interior of the equipment closet. The cooling system is configured to use only transfer air for cooling when the transfer air provides sufficient cooling. When additional cooling is needed, the cooling system is configured to operate the direct expansion cooling circuit to provide additional cooling. In an aspect, the direct expansion cooling circuit when operating draws transfer air in, cools the transfer air and then discharges the cooled transfer air into the interior of the equipment closet. When the direct expansion cooling circuit is operating, the condenser fan and evaporator fan operate in tandem to split the incoming intake transfer air into two air streams, a condenser coil air stream that flows across a condenser coil of the condenser to cool refrigerant flowing through the condenser coil and an evaporator coil air stream that flows across an evaporator coil of the evaporator. The evaporator coil air stream is cooled via direct expansion refrigeration as it flows across the evaporator coil and discharged into the interior of the equipment closet. The condenser coil air stream is used to reject the direct expansion refrigeration heat to the ceiling space.

In an aspect, the lower portion of the cabinet has a transfer air inlet through which air is drawable from an area of the building outside of the equipment closet and surrounding the transfer air inlet and the upper portion of the cabinet has a transfer air inlet through which air is drawable from an area of the building outside the equipment closet and surrounding the transfer air inlet of the upper portion of the cabinet. The cabinet has a hot air outlet configured to open to a ceiling space above the equipment closet. The condenser has a condenser coil and a condenser fan that discharges air drawn across the condenser coil by the condenser fan out through a hot air outlet of the upper portion of the cabinet. The evaporator has an evaporator coil and an evaporator fan that blows air drawn across the evaporator coil by the evaporator fan out through a cool air outlet of the lower portion of the cabinet.

In an aspect, at least a portion of the upper portion of the cabinet is configured to be disposed in the ceiling space wherein the condenser is disposed in that portion of the cabinet. In an aspect, the cabinet is configured to be disposed entirely within the equipment closet.

In a variation, the cooling system is a high wall mounted/above ceiling mounted system. In an aspect, the components of this cooling system are disposed in a cabinet with an upper portion of the cabinet disposed in the ceiling space and a lower portion of the cabinet disposed in the equipment closet and in an aspect secured to a wall of the equipment closet. In an aspect, the compressor and condenser are disposed in the upper portion of the cabinet and the evaporator disposed in the lower portion of the cabinet. A condenser fan of the condenser draws air in from the interior of the equipment closet and across the condenser coil and then discharges the air into the ceiling space. This in turn causes a negative pressure in the interior of the equipment closet that draws transfer air into the equipment closet from an area surrounding the equipment closet. This cooling system variation has the same two basic modes of operation described above. In an aspect, the cooling system includes a damper that is movable between a first position where it blocks air flow through an interior air inlet of the upper portion of the cabinet that opens to the interior of the equipment closet and does not block air flow through an exterior air inlet of the upper portion of the cabinet that opens to an area of the building outside of the equipment closet and surrounding the exterior air inlet and a second position where it does not block air flow through the interior air inlet and blocks air flow through the exterior air inlet. When the damper is in the second position, the cooling system operates as described above. When the damper is in the first position, an air path from the interior of the equipment closet is closed and an air path from the ceiling space is opened. Air from the area of the building surrounding the exterior air inlet is then drawn across the condenser coil by the condenser fan to cool refrigerant flowing through the condenser coil.

In an aspect, the transfer air is cooled by a building cooling system before the transfer air is drawn into the cabinet of the cooling system that cools the equipment closet or into the interior of the equipment closet, as applicable.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
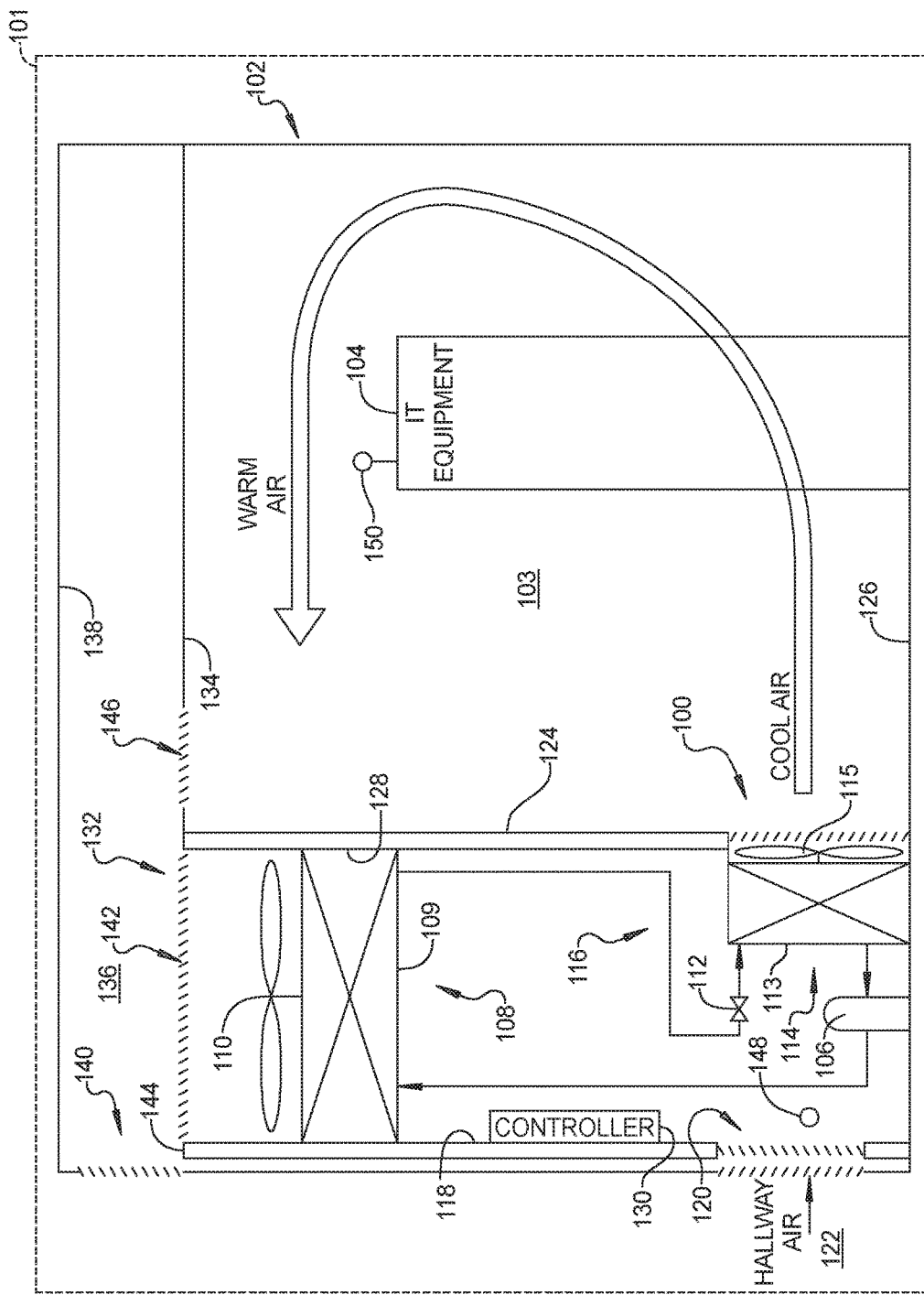
FIG. 1 is a simplified diagrammatic view of a cooling system in accordance with an aspect of the present disclosure disposed in an equipment closet.

FIG. 1 shows a floor mounted and wall facing equipment closet cooling system 100 in accordance with an aspect of the present disclosure. Cooling system 100 is located in an equipment closet 102 in which heat generating equipment 104, such as servers, is disposed. Equipment closet 102 is disposed in a building 101. Cooling system 100 is a direct expansion (DX) cooling system having a compressor 106, a condenser 108 having a condenser coil 109 and a condenser fan 110, an expansion device 112, and an evaporator 114 having an evaporator coil 113 and an evaporator fan 115, which in an aspect, may be a squirrel cage blower. Compressor 106, condenser 108, expansion device 112 and evaporator 114 are arranged in a DX cooling circuit 116. Cooling system 100 is located adjacent a wall 118 of equipment closet 102 and has a transfer air inlet 120 opening to an area 122 of the building outside of equipment closet 102 and surrounding transfer air inlet 120, such as a hallway outside of equipment closet 102. Air in this area 122 is cooled by a cooling system of the building. In an aspect, cooling system 100 is illustratively a self-contained cooling system housed in a cabinet 124 that sits on a floor 126 of equipment closet 102 with evaporator 114 and compressor 106 also sitting on the floor of equipment closet 102 or on a floor (not shown) of cabinet 124. Condenser 108 is illustratively mounted in cabinet 124 in a top portion 128 of cabinet 124. Cooling system 100 includes a controller 130 that is configured to control cooling system 100, DX cooling circuit 116 in particular. Controller 130 includes inputs/outputs coupled to the various components of DX cooling circuit 116. Among the inputs coupled to controller 130 of cooling system 300 are an air intake temperature sensor 148 and an equipment closet interior air temperature sensor 150.

Cooling system 100 draws transfer air in from the area 122 through transfer air inlet 120 that is then used in cooling the interior 103 of equipment closet 102 in the manner described below. Cooling system 100 has two basic modes of operation: (1) where DX cooling circuit 116 is off and transfer air is drawn in from area 122 and used to cool interior 103 of equipment closet 102 without any DX cooling; and (2) where DX cooling circuit 116 is running and provides DX cooling that is used to cool the interior 103 of equipment closet 102. Controller 130 is configured to control cooling system 100 to operate in mode 1 when the heat load is sufficiently small that the transfer air can sufficiently cool the equipment 104 in equipment closet 102 without any cooling provided by DX cooling circuit 116 and to operate in mode 2 when the heat load is large enough that the transfer air cannot adequately cool equipment 104 without cooling provided by DX cooling circuit 116. When cooling system 100 is operating in mode 1, controller 130 is configured to have evaporator fan 115 on, compressor 106 off and condenser fan 110 off. Evaporator fan 115 draws transfer air in through transfer air inlet 120 from the area 122 of the building surrounding transfer air inlet 120 and then discharges this transfer air into the interior 103 of equipment closet 102. The transfer air picks up the heat generated by equipment 104 and is then exhausted through an opening 146 in drop ceiling 134 (which provides a hot air outlet of equipment closet 102) into ceiling space 136 between drop ceiling 134 and ceiling 138 that is above equipment closet 102 and then from ceiling space 136 through discharge opening 140 into an area of the building outside of the equipment closet 102.

When cooling system 100 is operating in mode 2, controller 130 is configured to operate DX cooling circuit 116 to provide DX cooling with compressor 106 running and condenser fan 110 and evaporator fan 115 also running. Evaporator fan 115 draws transfer air in from area 122 through transfer air inlet 120 which is then cooled by the DX cooling provided by DX cooling circuit 116 as this air passes across evaporator coil 113 of evaporator 114. This cooled air is then discharged by evaporator fan 115 into the interior 103 of equipment closet 102. Condenser fan 110 also draws air in from area 122 through transfer air inlet 120 which then passes across condenser coil 109 and cools refrigerant flowing through condenser coil 109. Hot air is then discharged by condenser fan 110 from a hot air exhaust 142 of cabinet 124, illustratively located at a top 144 of cabinet 124, through opening 132 in drop ceiling 134 out into equipment closet 102. The hot air in equipment closet 102 is then exhausted from equipment closet 102 through another opening 146 in drop ceiling 134 into ceiling space 136 between drop ceiling 134 and ceiling 138 that is above equipment closet.

Cooling system 100, since it is floor mounted in particular, overcomes the obstacle presented by mounting heavy components on the wall or ceiling of an equipment closet. The heavy components, compressor 106 in particular, sits on the floor of equipment closet 102 or on the floor of cabinet 124 that sits on the floor of equipment closet 102. By using transfer air for cooling when heat load is low, cooling system 100 has the advantage of increased efficiency compared to cooling systems that recirculate air from the equipment closet. Cooling system 100 also has the advantage of increased efficiency when operating in the mode 2 (the DX mode) by using transfer air as the air that is cooled by cooling system 100 rather than air recirculated from equipment closet 102 since the transfer air is cooler than the air in equipment closet 102 and thus needs less cooling by DX cooling circuit 116.

Figure 2:
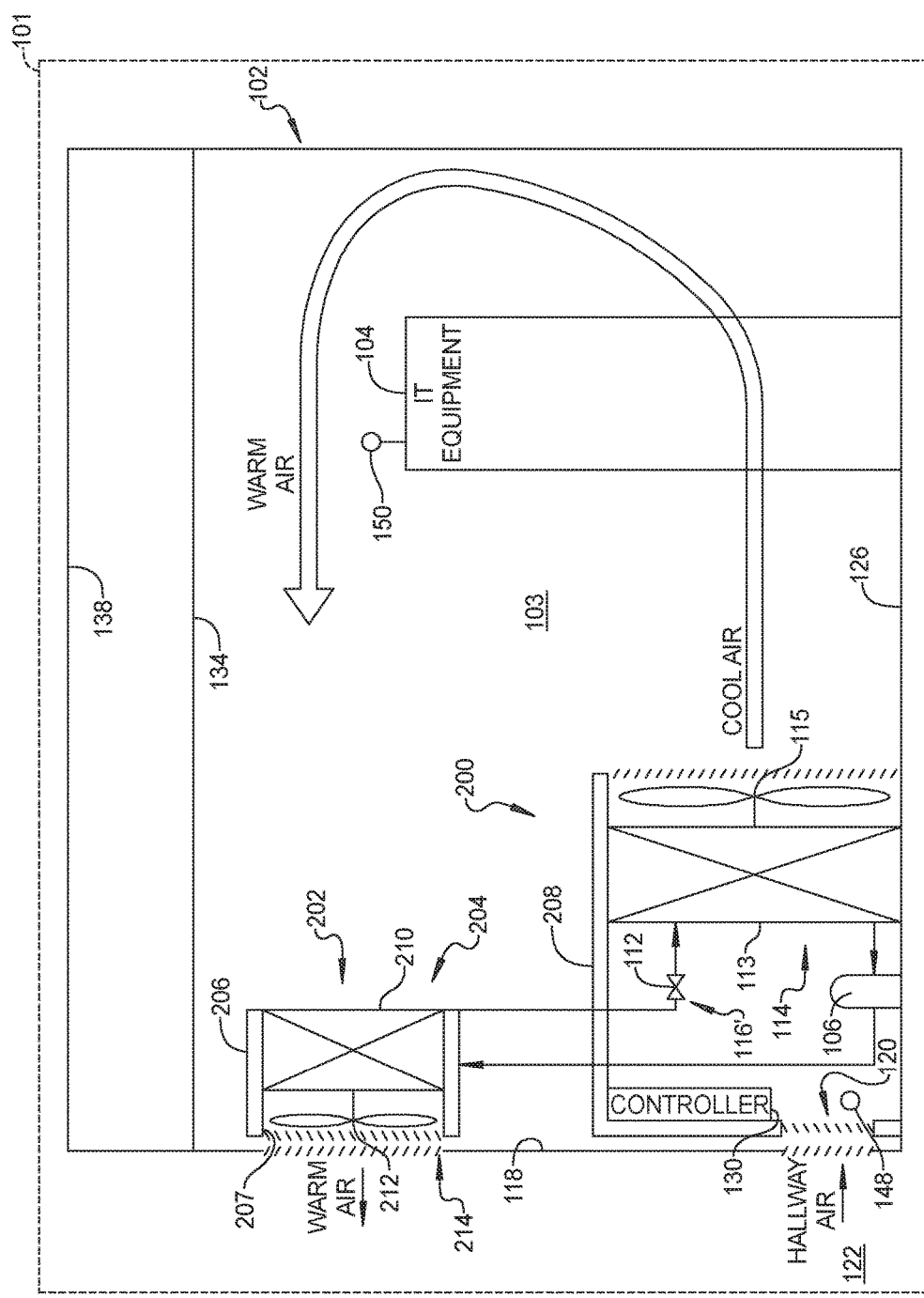
FIG. 2 is a simplified diagrammatic view of a split-modular cooling system in accordance with an aspect of the present disclosure disposed in an equipment closet.

In another variation shown in FIG. 2, a split-modular cooling system 200 has DX cooling circuit 116' that has a light weight fan coil portion 202 of an air cooled condenser 204 disposed in a cabinet 206 mounted on wall 118 of equipment closet 102 and the remaining components of DX cooling circuit 116' disposed in a cabinet 208 sitting on a floor 126 of equipment closet 102. Fan coil portion 202 includes a condenser coil 210 and a condenser fan 212. Cabinet 206 has a hot air outlet 207. Wall 118 has an exhaust outlet 214 and hot air exiting condenser coil 210 is discharged out of equipment closet 102 through hot air outlet 207 and then through exhaust outlet 214 by condenser fan 212 when it is running which also pulls air from the interior 103 of equipment closet 102 across condenser coil 210. Cooling system 200 is also a DX cooling system and except as described above, has the same components as cooling system 100. In this regard, except as described, DX cooing circuit 116' is the same as DX cooling circuit 116.

Cooling system 200 has the same two basic modes of operation as cooling system 100. It should be understood that when cooling system 200 is in the first mode of operation, controller 130 is configured to have condenser fan 212 off. Hot air from equipment room passes across condenser coil 210 out through hot air outlet 207 of cabinet 206 and then out through exhaust outlet 214 in wall 118 due to positive pressure created in equipment closet 102 by evaporator fan 115 discharging air into the interior 103 of equipment closet 102.

Cooling system 200, since the heavy components such as compressor 106 in particular are floor mounted, also overcomes the obstacle presented by mounting heavy components on the wall or ceiling of an equipment closet. It also has the same efficiency advantages as cooling system 100.

Figure 3A:
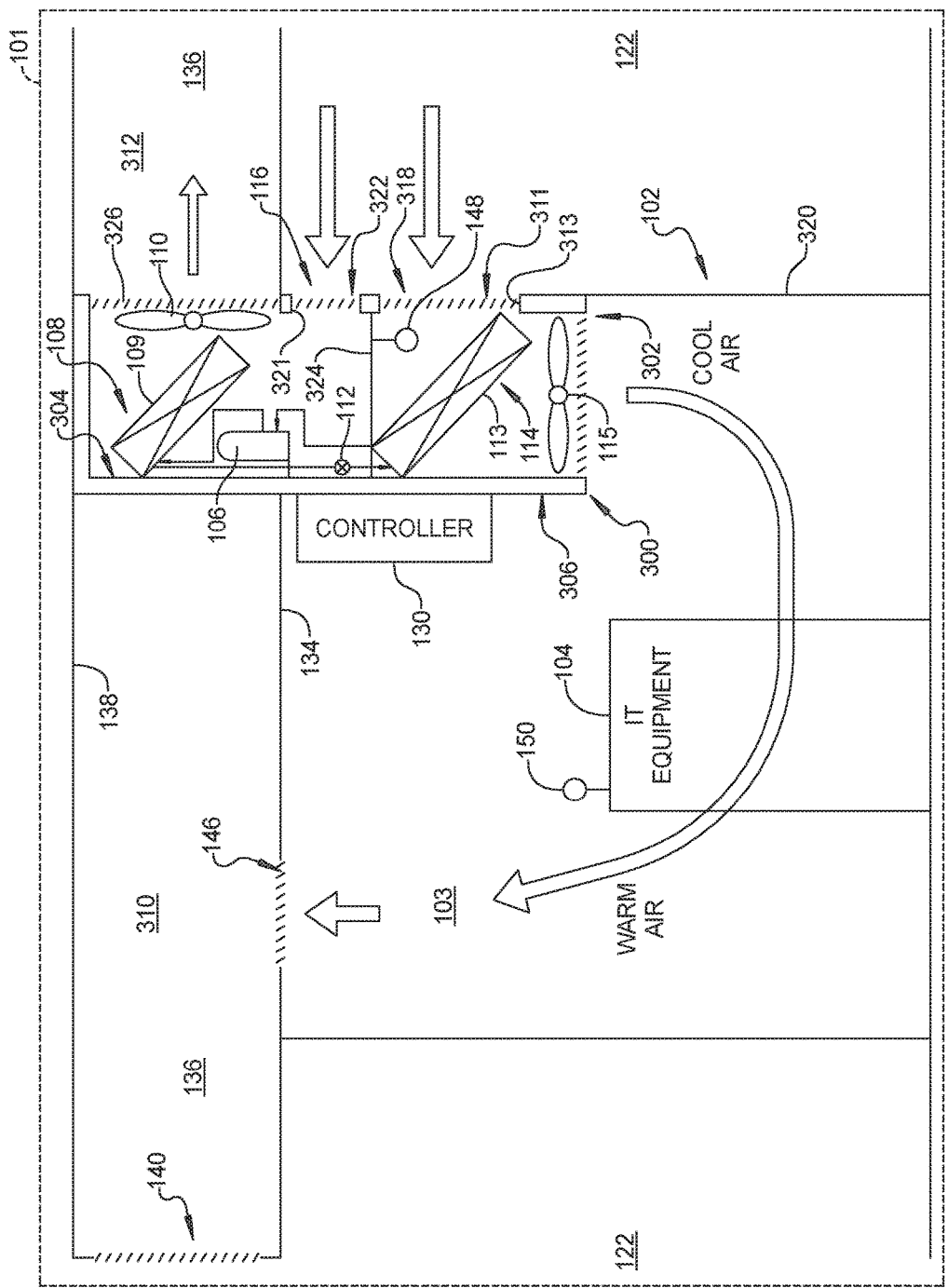
FIG. 3A is a simplified diagrammatic view of a cooling system in accordance with an aspect of the present disclosure disposed in an equipment closet.

FIG. 3A shows a cooling system 300 in accordance with an aspect of the present disclosure for cooling an interior 103 of equipment closet 102 and thus cooling equipment 104 located in equipment closet 102. Cooling system 300 is a self-contained cooling system with associated sensors that can monitor air volume conditions within equipment closet 102 and area(s) surrounding equipment closet 102, such as area 122. Cooling system 300 is partially located in equipment closet 102 in which heat generating equipment 104, such as servers, is disposed and partially located in a portion 312 of ceiling space 136 above equipment closet 102. Cooling system 300 is also a DX cooling system having DX cooling circuit 116 but with the components of DX cooling circuit 116 located differently than those of cooling systems 100 and 200, as described below.

In an aspect, cooling system 300 is a high wall mounted/above ceiling mounted system. In an aspect, the components of cooling system 300 are disposed in a cabinet 302 with an upper portion 304 of cabinet 302 disposed in portion 312 of ceiling space 136. A lower portion 306 of cabinet 302 is disposed in equipment closet 102 beneath drop ceiling 134 and illustratively secured to a wall 320 of equipment closet 102. Cabinet 302 includes a wall 324 between the upper and lower portions 304, 306 of cabinet 302 thus providing separate transfer air flow paths through the upper and lower portions 304, 306 of the cabinet 302. Evaporator 114 is disposed in lower portion 306 of cabinet 302. Compressor 106 and condenser 108 are disposed in upper portion 304 of cabinet 302. Lower portion 306 of cabinet 302 has an air filter 311 in a transfer air inlet 313 through which transfer air is drawn in by evaporator fan 115 through a transfer air inlet 318 in wall 320 of equipment closet 102 and transfer air inlet 313. Evaporator fan 115 also draws the hallway air across evaporator coil 113 and then discharges it out into the interior 103 of equipment closet 102. Evaporator fan 115 positively pressurizes the interior 103 of equipment closet 102 and the air discharged from evaporator 114 passes across equipment 104 and the air heated by equipment 104 is then discharged through opening 146 in drop ceiling into the area 310 of ceiling space. Upper portion 304 of cabinet 302 also has a transfer air inlet 321 through which transfer air is drawn through a transfer air inlet 322 in wall 320 of equipment closet 102 when condenser fan 110 is running. When DX cooling circuit 116 is running, condenser fan 110 draws transfer air in from the area adjacent equipment closet 102 such as area 122 through transfer air inlet 322 and across condenser coil 109 and then discharges the air heated by condenser coil 109 into second portion 312 of the ceiling space 136 outside of equipment closet 102 and away from the hot air outlet of the equipment closet 102 through which the air from the equipment closet 102 is exhausted into the ceiling space.

Cooling system 300 has the same two basic modes of operation as cooling system 100. That is, in mode 1 evaporator fan 115 is on, compressor 106 is off and condenser fan 110 is off. In this mode, only transfer air is used to provide cooling for the interior 103 of equipment closet 102. In mode 2, DX cooling circuit 116 is operating with compressor 106 running, condenser fan 110 running and evaporator fan 115 running. The transfer air drawn in by evaporator fan 115 is further cooled as it passes across evaporator coil 113 and the cooled transfer air then discharged into the interior 103 of equipment closet 102 to cool the interior 103 of equipment closet 102.

In cooling system 300, the transfer air is pulled directly from the surrounding air volume, that is, from an area adjacent equipment closet 102 such as area 122. When DX cooling circuit 116 is running, condenser fan 110 and evaporator fan 115 operate in tandem to split the incoming transfer air into two air streams, a condenser coil air stream that flows through the upper portion 304 of cabinet 302 across condenser coil 109 to cool refrigerant flowing through condenser coil 109 and an evaporator coil air stream that flows through lower portion 306 of cabinet 302 across evaporator coil 113. The evaporator coil air stream is cooled via DX refrigeration as it flows across evaporator coil 113 and discharged into the interior 103 of equipment closet 102. The condenser coil air stream is used to reject the DX refrigeration heat to portion 312 of ceiling space 136 in the false ceiling of equipment closet 102.

Figure 3B:
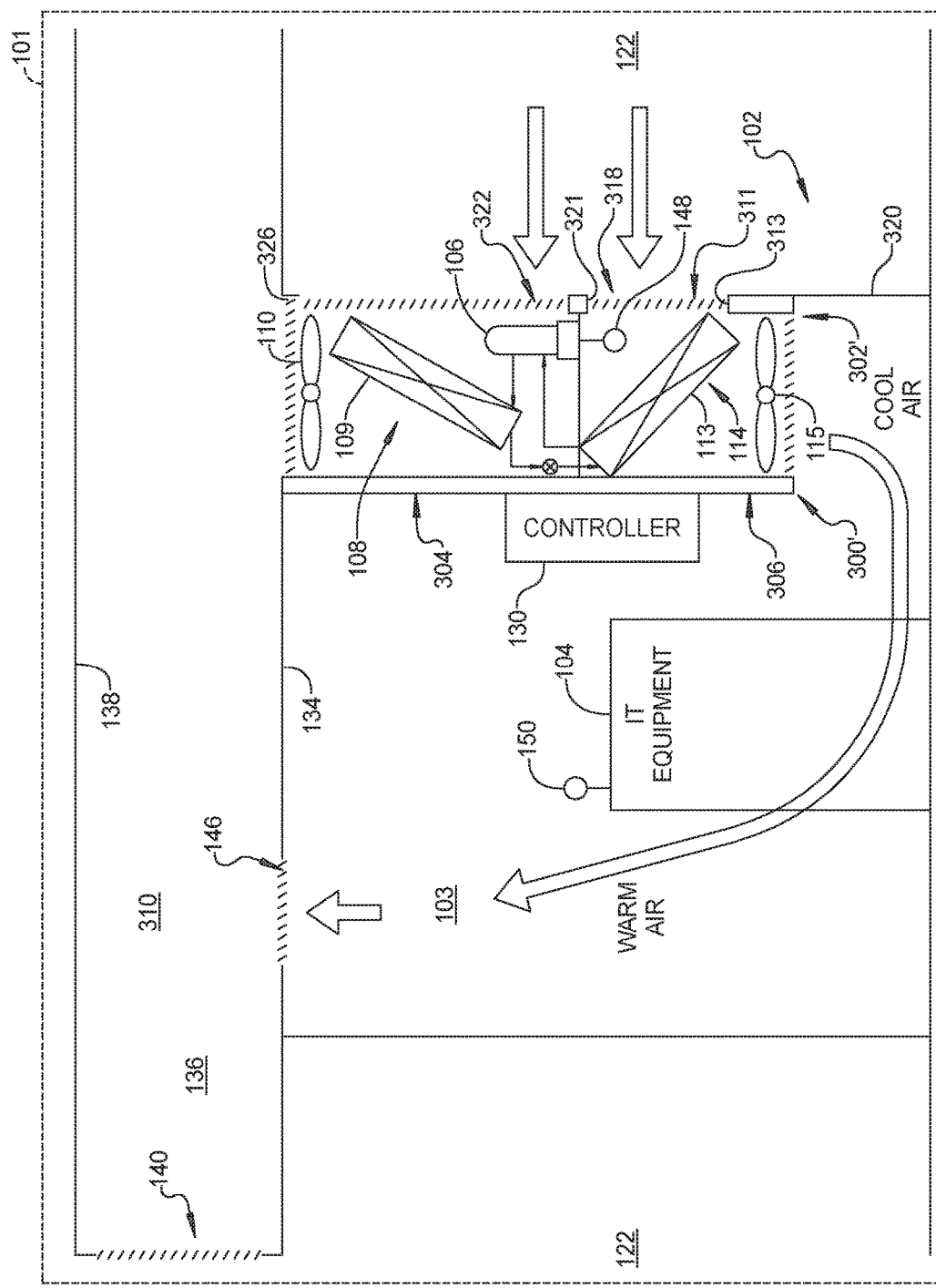
FIG. 3B is a simplified diagrammatic view of a variation of the cooling system of FIG. 3A.

FIG. 3B shows a cooling system 300' that is a variation of cooling system 300 shown in FIG. 3A. Cooling system 300' is a high wall mounted system with cabinet 302' of cooling system 300' disposed entirely within equipment closet 102 and upper and lower portions 304, 306 of cooling system 300' thus disposed entirely within equipment closet 102. In the embodiment shown in FIG. 3B, cabinet 302' has a hot air outlet 326 that opens to ceiling space 136 and through which hot air is discharged by condenser fan 110 into ceiling space 136. Cooling system 300' otherwise operates the same as cooling system 300.

Figure 4:
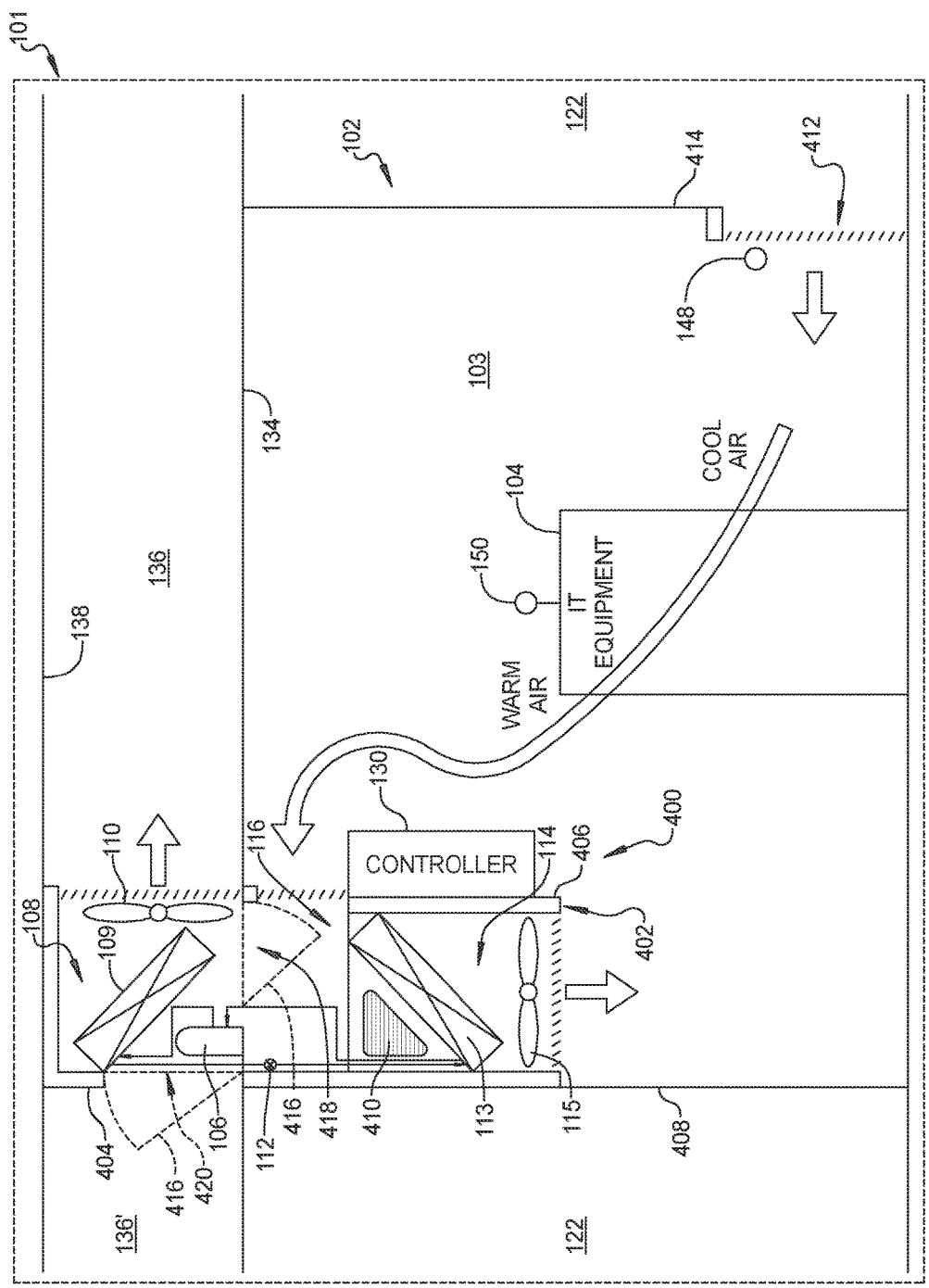
FIG. 4 is a simplified diagrammatic view of another cooling system in accordance with an aspect of the present disclosure disposed in an equipment closet.

FIG. 4 shows a cooling system 400 that is another variation of cooling system 300. Cooling system 400 is also a self-contained cooling system with associated sensors that can monitor air volume conditions within equipment closet 102 and area(s) surrounding equipment closet 102, such as area 122. Cooling system 400 is partially located in equipment closet 102 in which heat generating equipment 104, such as servers, is disposed and partially located in ceiling space 136 above equipment closet 102. Cooling system 400 is also a DX cooling system having DX cooling circuit 116 but with the components of DX cooling circuit 116 located differently than those of cooling systems 100 and 200, as described below.

Cooling system 400 is a high wall mounted/above ceiling mounted system. In an aspect, the components of cooling system 400 are disposed in a cabinet 402 with an upper portion 404 of cabinet 402 disposed in ceiling space 136. A lower portion 406 of cabinet 402 is disposed in equipment closet 102 beneath drop ceiling 134 and illustratively secured to a wall 408 of equipment closet 102. Compressor 106 and condenser 108 are disposed in upper portion 404 of cabinet 402 and evaporator 114 disposed in lower portion 406. Lower portion 406 of cabinet 402 has an air filter 410 through which air passes before passing through evaporator coil 113. It should be understood that upper and lower portions 404, 406 of cabinet 402 could be separate cabinets with the reference to each then being a reference to a separate cabinet.

In both modes of operation described below, condenser fan 110 is running and can draw air in from the interior 103 of equipment closet 102 through interior air inlet 418 of upper portion 404 of cabinet 402 and across condenser coil 109 and then discharges the air into ceiling space 136. This in turn causes a negative pressure in the interior 103 of equipment closet 102 that draws transfer air in through transfer air inlet 412 of equipment closet 102 from an area of the building surrounding transfer air inlet 412 of equipment closet 102, such as area 122. In an aspect, transfer air inlet 412 is located in a wall 414 of equipment closet 102 that is opposite wall 408 of equipment closet 102, and thus at an opposite side of equipment closet 102 than cooling system 400.

When DX cooling circuit 116 is running, air from the interior 103 of equipment closet 102 is drawn through air filter 410 and across evaporator coil 113 by evaporator fan 115 which then discharges the air cooled by the passage across evaporator coil 113 out into the interior 103 of equipment closet 102.

Cooling system 400 has the same two basic modes of operation as cooling system 100. That is, in mode 1 only transfer air is used to cool the equipment 104 in the interior 103 of equipment closet 102. In mode 1, compressor 106 is off, condenser fan 110 is on and evaporator fan 115 is off. As discussed above, condenser fan 110 draws air in from the interior 103 of equipment closet 102, which in turn draws transfer air in through transfer air inlet 412 from area 122, and then discharges it out into ceiling space 136.

In mode 2, DX cooling circuit 116 is running with compressor 106 running, condenser fan 110 running and evaporator fan 115 running. Both condenser fan 110 and evaporator fan 115 draw air in from the interior 103 of equipment closet 102 which in turn draws transfer air into the interior 103 of equipment closet 102 from area 122 through transfer air inlet 412. The transfer air drawn in by evaporator fan 115 is further cooled as it passes across evaporator coil 113 and the cooled air is then discharged into the interior 103 of equipment closet 102 to cool the interior 103 of equipment closet 102. In mode 2, both the transfer air drawn in from area 122 and the air as further cooled by DX cooling circuit 116 provides cooling of the interior 103 of equipment closet 102 and thus cooling of equipment 104.

In a variation, cooling system 400 includes a damper 416 shown in phantom in FIG. 4 that is movable between a first position where it blocks air flow through interior air inlet 418 of upper portion 404 of cabinet 402 to condenser 108 and does not block air flow through an exterior air inlet 420 in wall 408 to condenser 108 and a second position where it does not block air flow through interior air inlet 418 and blocks air flow through exterior air inlet 420. Exterior air inlet 420 opens to an area of the building that is outside of equipment closet 102 and surrounding exterior air inlet 420, such as ceiling space 136.' Damper 416 has an actuator (not shown) controlled by controller 130 that moves damper 416 between its first and second positions. When damper 416 is in the second positon where it blocks air flow through exterior air inlet 420 and does not block air flow through interior air inlet 418, cooling system 400 operates as described above. When damper 416 is in the first position where it blocks air flow through interior air inlet 418 and does not block air flow through exterior air inlet 420, the air path from the interior 103 of equipment closet 102 is closed and an air path from ceiling space 136' is opened. Air from ceiling space 136' is then drawn across condenser coil 109 by condenser fan 110 to cool refrigerant flowing through condenser coil 109. This has the benefits of eliminating negative air pressure in the interior 103 of equipment closet 102, eliminates loss of air cooled by evaporator 114 and increases the likelihood that DX cooling circuit 116 will modulate capacity (saving energy) if the load is light and the desired temperature in interior 103 of equipment closet 102 is achieved.

Figure 5:
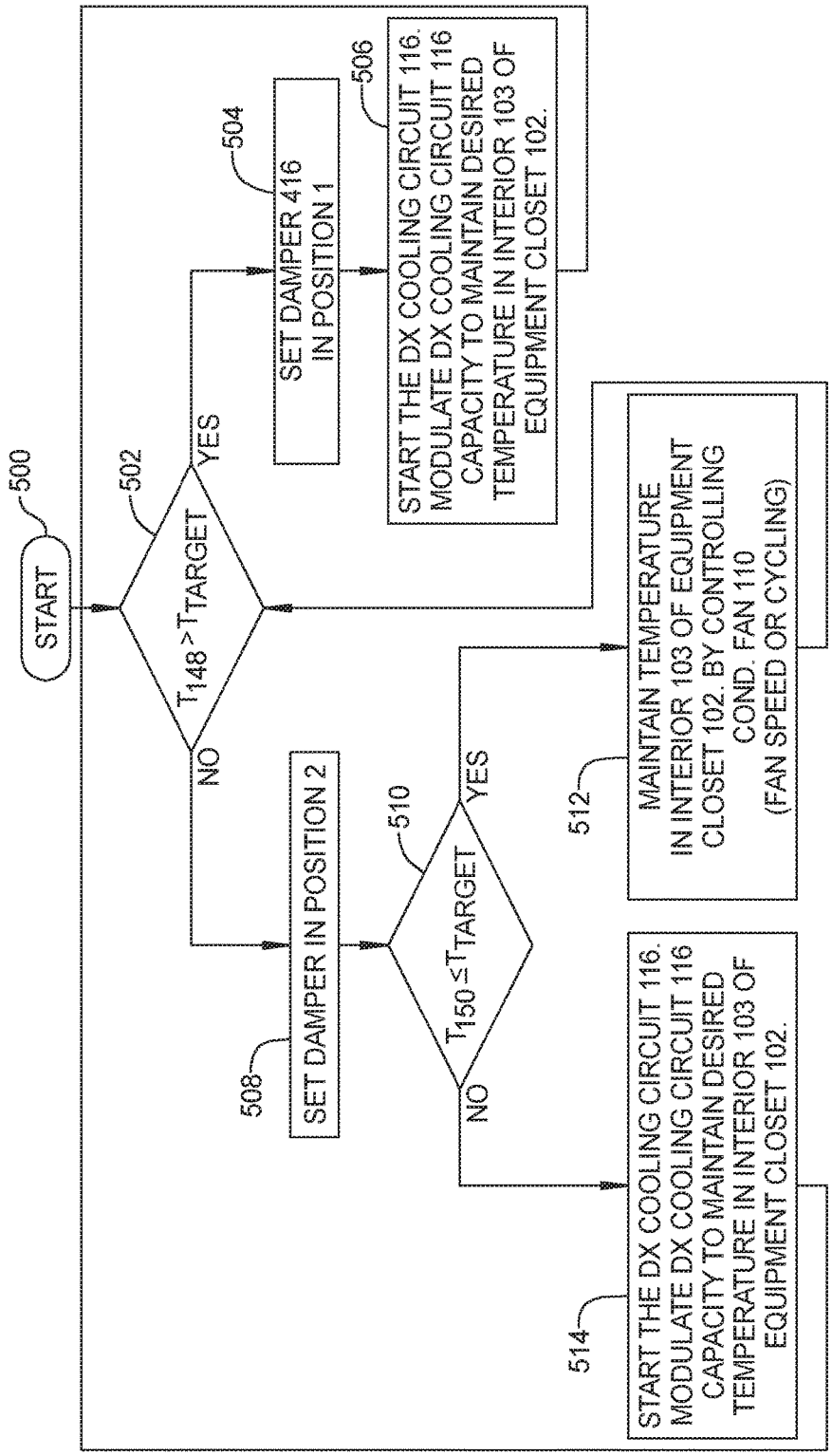
FIG. 5 is a flow chart showing an illustrative control of mode of operation and damper position of an aspect of the cooling system of FIG. 4 in accordance with an aspect of the present disclosure.

FIG. 5 is a flow chart showing an illustrative simplified control routine for control of cooling system 400, the mode of operation of DX cooling circuit 116 and positon of damper 416 in particular, in accordance with an aspect of the present disclosure. The control routine starts at 500. At 502, the control routine checks whether the temperature of the transfer air being drawn in from area 122 (sensed by air intake temperature sensor 148 ($T_{148}$) is greater than a target temperature ($T_{target}$). If so, the control routine branches to 504 where it sets damper 416 to the first position, referred to as position 1 in block 504 of FIG. 5, where it blocks air flow through interior air inlet 418 of upper portion 404 of cabinet 402 and does not block air flow through exterior air inlet 420. That is, damper 416 is positioned so that interior air inlet 418 is closed and exterior air inlet 420 is open. The control routine then proceeds to 506 where it starts DX cooling circuit 116 and modulates DX cooling circuit 116 capacity to maintain a desired temperature in interior 103 of equipment closet 102. The control routine then returns to 502.

If at 502 the temperature of the air being drawn in from area 122 ($T_{148}$) is not greater than the target temperature ($T_{target}$), the control routine branches to 508 whether it sets damper 416 to the second position, referred to as position 2 in block 508 of FIG. 5, where it does not block air flow through interior air inlet 418 and blocks air flow through exterior air inlet 420. That is, damper 416 is positioned so that interior air inlet 418 is open and exterior air inlet 420 is closed. The control routine then proceeds to 510 where it checks if the temperature in interior 103 of equipment closet 102 sensed by temperature sensor 150 ($T_{150}$) is less than or equal than the target temperature ($T_{target}$). If so, the control routine branches to 512 where it maintains the temperature in interior 103 of equipment closet 102 by controlling condenser fan 110 (fan speed, cycling, or both). The control routine then returns to 502. If at 508 the temperature in interior 103 of equipment closet 102 ($T_{150}$) is greater than the target temperature ($T_{target}$), the control routine branches to 514 where it starts DX cooling circuit 116 and modulates DX cooling circuit 116 capacity to maintain a desired temperature in interior 103 of equipment closet 102. The control routine then returns to 502. It should be understood that the foregoing control routine is implemented in controller 130.

As used herein, "transfer air" is air that is drawn into one of the foregoing cooling systems or equipment closet 102, as applicable, from area 122 of the building outside the equipment closet 102 where the air has been cooled by the building cooling system prior to being drawn in.

It should be understood that controller 130 may be, be part of, or include an Application Specific Integrated Circuit (ASIC); an electronic circuit; a combinational logic circuit; a field programmable gate array (FPGA); a processor (shared, dedicated, or group) that executes code; a programmable logic controller, a programmable control system such as a processor based control system including a computer based control system, a process controller such as a PID controller, or other suitable hardware components that provide the described functionality or provide the above functionality when programmed with software as described herein; or a combination of some or all of the above, such as in a system-on-chip. The term module may include memory (shared, dedicated, or group) that stores code executed by the processor. The term software, as used herein, may refer to computer programs, routines, functions, classes, and/or objects and may include firmware, and/or microcode. When it is stated that controller 130 performs a function, it should be understood that controller 130 is configured to do so such as by appropriate software, electronic circuit(s) including discrete and integrated logic, or combination thereof.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of cooling an equipment closet in a building with a cooling system, the cooling system having a direct expansion cooling circuit that includes a compressor, a condenser having a condenser coil and a condenser fan, an expansion device and an evaporator having an evaporator coil and an evaporator fan that are arranged in the direct expansion cooling circuit, the method comprising:

disposing a cabinet at least partially in the equipment closet wherein at least the condenser is disposed in an upper portion of the cabinet and the evaporator is disposed in a lower portion of the cabinet;

separating the lower portion of the cabinet from the upper portion of a cabinet with a first wall to provide separate air flow paths through the upper portion of the cabinet and the lower portion of the cabinet;

operating the cooling system in a first mode of operation with the direct expansion cooling circuit off to cool an interior of the equipment closet with transfer air drawn in from an area of the building outside of the equipment closet and operating the cooling system in a second mode of operation with the direct expansion cooling circuit running to cool the interior of the equipment closet with air cooled by the direct expansion cooling circuit;

controlling operation of the cooling system with a controller by having the controller operate the cooling system in the first mode of operation when the controller determines that operating the cooling system in the first mode of operation will meet a cooling demand due to heat load in the interior of the equipment closet and having the controller operate the cooling system in the second mode of operation when the controller determines that operating the cooling system in the first mode of operation will not meet the cooling demand;

when operating the cooling system in the first mode of operation drawing transfer air in through a transfer air inlet of the lower portion of the cabinet from an area of the building outside of the equipment closet and surrounding the transfer air inlet of the lower portion of the cabinet and when operating the cooling system in a second mode of operation drawing transfer air in through the transfer air inlet in the lower portion of the cabinet and cooling it with the direct expansion cooling circuit;

creating a positive pressure in the interior of the equipment closet by the discharge of air with the evaporator fan through a cool air outlet of the lower portion of the cabinet into the interior of the equipment closet to force air in the interior of the equipment closet out through a hot air outlet of the equipment closet; and wherein having the controller operate the cooling system in the first mode of operation includes having the controller operate the cooling system with the condenser fan off and the evaporator fan running and drawing transfer air in with the evaporator fan through the transfer air inlet of the lower portion of the cabinet and with the evaporator fan discharging this air out through the cool air outlet of the lower portion of the cabinet into the interior of the equipment closet; and wherein having the controller operate the cooling system in the second mode of operation includes having the controller operate the cooling system with the condenser fan running and the evaporator fan running and drawing transfer air in with the condenser fan through a transfer air inlet of the upper portion of the cabinet and across the condenser coil to cool refrigerant flowing through the condenser coil and after this air passes across the condenser coil discharging this air with the condenser fan out through a hot air outlet of the upper portion of the cabinet into a ceiling space and also drawing transfer air in with the evaporator fan through the transfer air inlet of the lower portion of the cabinet and across the evaporator coil to cool the air with refrigerant flowing through the evaporator coil and with the evaporator fan discharging the cooled air out through the cool air outlet of the lower portion of the cabinet into the interior of the equipment closet.

2. The method of claim 1 including disposing the cabinet partially in the equipment closet and partially in the ceiling space above the equipment closet with the lower portion of the cabinet disposed in the equipment closet and at least a portion of the upper portion of the cabinet disposed in the ceiling space wherein at least the condenser is disposed in the portion of the upper portion of the cabinet disposed in the ceiling space, and with the condenser fan pulling air across the condenser coil and discharging this air through a hot air outlet in the upper portion of the cabinet into the ceiling space and away from the hot air outlet of the equipment closet through which the air from the equipment closet is exhausted into the ceiling.

3. The method of claim 1 including disposing the cabinet entirely within the equipment closet with a hot air outlet of the cabinet opening to the ceiling space above the equipment closet and with the condenser fan pulling air across the condenser coil and discharging this air through the hot air outlet of the cabinet into the ceiling space.

* * * * *